(12) United States Patent
Wang et al.

(10) Patent No.: US 8,350,334 B2
(45) Date of Patent: Jan. 8, 2013

(54) STRESS FILM FORMING METHOD AND STRESS FILM STRUCTURE

(75) Inventors: Chun-Min Wang, Taichung (TW); An-Chi Liu, Tainan (TW); Hsin-Hsing Chen, Tainan (TW); Chih-Chun Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 80 days.

(21) Appl. No.: 13/158,541

(22) Filed: Jun. 13, 2011

(65) Prior Publication Data

US 2012/0313181 A1  Dec. 13, 2012

(51) Int. Cl.
*H01L 21/70* (2006.01)

(52) U.S. Cl. ......... 257/369; 257/E27.062; 257/E21.293; 438/199; 438/791

(58) Field of Classification Search .............. 257/369, 257/E27.062, E21.293; 438/199, 791
See application file for complete search history.

(56) References Cited

U.S. PATENT DOCUMENTS

| | | | |
|---|---|---|---|
| 2008/0020591 A1 | 1/2008 | Balseanu et al. | |
| 2008/0173986 A1* | 7/2008 | Junker et al. | 257/649 |
| 2008/0296631 A1* | 12/2008 | Chen et al. | 257/254 |
| 2011/0210401 A1* | 9/2011 | Junker et al. | 257/369 |
| 2012/0220086 A1* | 8/2012 | Baars et al. | 438/199 |

* cited by examiner

*Primary Examiner* — Trung Q Dang
(74) *Attorney, Agent, or Firm* — Ding Yu Tan

(57) ABSTRACT

A stress film forming method is used in a fabrication process of a semiconductor device. Firstly, a substrate is provided, wherein a first-polarity-channel MOSFET and a second-polarity-channel MOSFET are formed on the substrate. Then, at least one deposition-curing cycle process is performed to form a cured stress film over the first-polarity-channel MOSFET and the second-polarity-channel MOSFET. Afterwards, an additional deposition process is performed form a non-cured stress film on the cured stress film, wherein the cured stress film and the non-cured stress film are collectively formed as a seamless stress film.

20 Claims, 5 Drawing Sheets

STRESS FILM FORMING METHOD AND STRESS FILM STRUCTURE

FIELD OF THE INVENTION

The present invention relates to a stress film forming method and a stress film structure, and more particularly to a stress film forming method and a stress film structure for use in the fabrication process of a semiconductor device.

BACKGROUND OF THE INVENTION

Because the length of the gate can not be limitlessly reduced any more and new materials have not been proved to be used in a metal-oxide-semiconductor field-effect transistor (MOSFET), adjusting mobility has become an important role to improve the performance of the integrated circuit. For example, the lattice strain of the channel is widely applied to increase mobility during the process of fabricating the MOSFET. For example, the hole mobility of the silicon with the lattice strain can be 4 times as many as the hole mobility of the silicon without the lattice strain, and the electron mobility with the lattice strain can be 1.8 times as many as the electron mobility of the silicon without the lattice strain.

Consequently, a tensile stress can be applied to an n-channel of an n-channel metal-oxide-semiconductor field-effect transistor (NMOS) by changing the structure of the transistor, or a compressive stress can be applied to a p-channel of a p-channel metal-oxide-semiconductor field-effect transistor (PMOS) by changing the structure of the transistor. In a case that the channel is stretched, the electron mobility can be improved. Whereas, in a case that the channel is compressed, the hole mobility is improved. Generally, a silicon nitride (SiN) film is formed after the components of the MOSFET are finished. The silicon nitride film has a characteristic of high stress that is used for controlling the stress in the channel.

According to various depositing conditions, the silicon nitride film can be controlled to have the function of a tensile stress film or a compressive stress film. For example, the compressive stress film for increasing the hole mobility of the P-channel may be simply formed by a chemical vapor deposition (CVD) process. Whereas, the tensile stress film for increasing the electron mobility of the N-channel is formed by a plurality of deposition and curing cycle processes.

Therefore, there is a need of providing a stress film forming method and a stress film structure for use in the fabrication process of a complementary metal-oxide-semiconductor (CMOS).

SUMMARY OF THE INVENTION

In accordance with an aspect, the present invention provides a stress film forming method for use in a fabrication process of a semiconductor device. Firstly, a substrate is provided, wherein a first-polarity-channel MOSFET and a second-polarity-channel MOSFET are formed on the substrate. Then, at least one deposition-curing cycle process is performed to form a cured stress film over the first-polarity-channel MOSFET and the second-polarity-channel MOSFET. Afterwards, an additional deposition process is performed form a non-cured stress film on the cured stress film, wherein the cured stress film and the non-cured stress film are collectively formed as a seamless stress film.

In an embodiment, the substrate is a silicon substrate, and the cured stress film and the non-cured stress film are made of silicon nitride, wherein the first-polarity-channel MOSFET is an n-channel metal-oxide-semiconductor field-effect transistor (NMOS), and the second-polarity-channel MOSFET is a p-channel metal-oxide-semiconductor field-effect transistor (PMOS).

In an embodiment, the deposition-curing processes are performed by steps of: performing a deposition process to form a stress film over the first-polarity-channel MOSFET and the second-polarity-channel MOSFET, performing a curing process to convert the stress film into a cured stress film, and repeating the cycle of the deposition process and the curing process for at least once.

In an embodiment, the deposition processes of the deposition-curing cycle processes and the additional deposition process are chemical vapor deposition process, and the curing processes of the deposition-curing cycle processes are UV curing process.

In an embodiment, before the deposition-curing cycle processes, the stress film forming method further includes a step of depositing an etch stop layer over the substrate, so that the cured stress film is formed on a surface of the etch stop layer.

In an embodiment, the stress film forming method further includes a step of forming a silicon oxide cap layer on a surface of the seamless stress film.

In accordance with another aspect, the present invention provides a stress film forming method for use in a fabrication process of a semiconductor device. Firstly, a substrate is provided, wherein a first-polarity-channel MOSFET and a second-polarity-channel MOSFET are formed on the substrate. Then, at least one deposition-curing cycle processes are performed to form a cured stress film over the first-polarity-channel MOSFET and the second-polarity-channel MOSFET. Then, an additional deposition process is performed to form a non-cured stress film on the cured stress film. Afterwards, a semi-curing process is performed to convert the non-cured stress film into a semi-cured stress film, wherein an operating time of the semi-curing process is shorter than an operating time of any curing process of the deposition-curing cycle processes, wherein the cured stress film and the semi-cured stress film are collectively formed as a seamless stress film.

In accordance with a further aspect, the present invention provides a stress film structure formed over a first-polarity-channel MOSFET and a second-polarity-channel MOSFET, which are formed on a substrate. The stress film structure includes at least one cured stress film and a non-cured stress film. The cured stress film is formed over the first-polarity-channel MOSFET. The non-cured stress film is formed on a surface of the cured stress film, wherein the cured stress film and the non-cured stress film are collectively formed as a seamless stress film.

In accordance with a still aspect, the present invention provides a stress film structure formed over a first-polarity-channel MOSFET and a second-polarity-channel MOSFET, which are formed on a substrate. The stress film structure includes at least one cured stress film and a semi-cured stress film. The cured stress film is formed over the first-polarity-channel MOSFET. The semi-cured stress film is formed on a surface of the cured stress film, wherein the cured stress film and the semi-cured stress film are collectively formed as a seamless stress film.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1E are schematic cross-sectional views illustrating a partial process flow of a stress film forming method in the fabrication process of a complementary metal-oxide-semiconductor (CMOS) device according to an embodiment of the present invention.

Figure 1A:
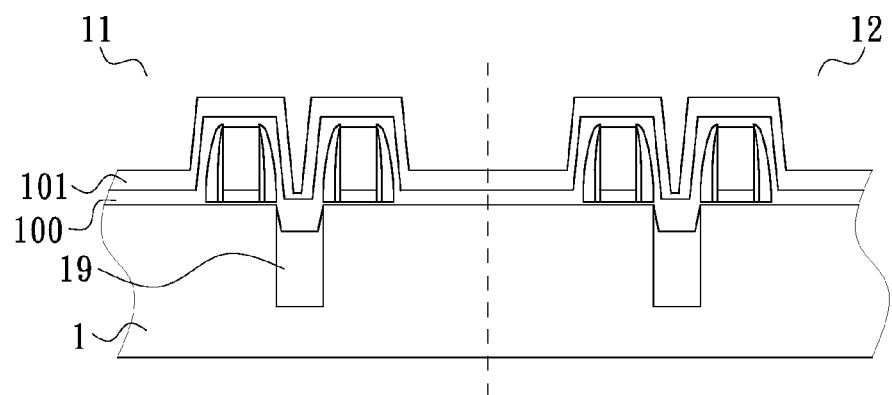
FIGS. 1A~1E are schematic cross-sectional views illustrating a partial process flow of a stress film forming method in the fabrication process of a CMOS device according to an embodiment of the present invention.

Firstly, an n-channel MOSFET 11 and a p-channel MOSFET 12 are formed on a silicon substrate 1. In addition, a shallow trench isolation (STI) structure is formed in the silicon substrate 1 to isolate adjacent components from each other. Then, a silicon oxide layer is deposited on the n-channel MOSFET 11, the p-channel MOSFET 12 and the silicon substrate 1 to be used as an etch stop layer 100. Then, a stress film 101 (e.g. a silicon nitride film) is deposited on the surface of the etch stop layer 100. The resulting structure is shown in FIG. 1A.

Figure 1B:
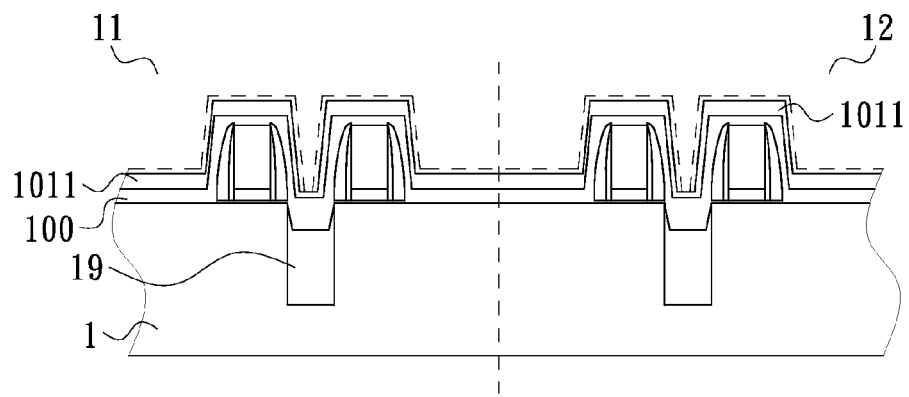
Figure 1C:
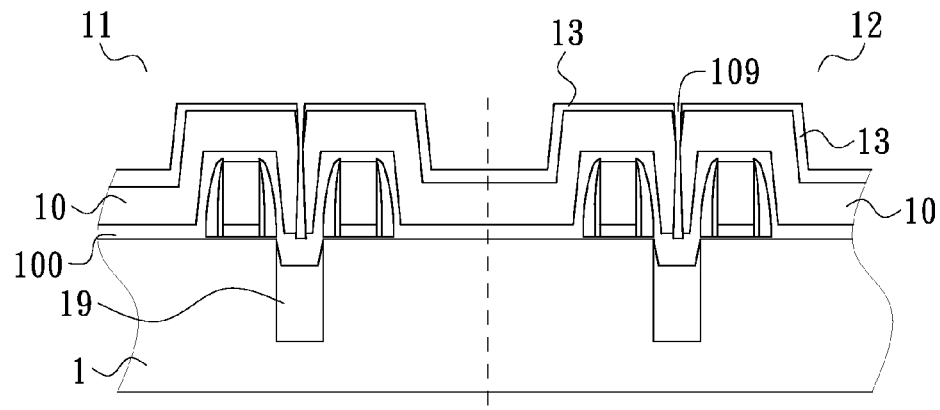

For example, for applying a tensile stress to the n-channel of the n-channel MOSFET 11, a curing process is performed to convert the stress film 101 into a cured stress film 1011 (see FIG. 1B). In comparison with the stress film 101, the shrinkage percentage of the cured stress film 1011 in volume is about 10%. For further increasing the tensile stress, several deposition and curing cycle processes will be done. For example, after the above procedures of depositing the stress film 101 and curing the stress film 101 are repeatedly done for four times, a cured multi-layered stress film 10 including four cured stress film is produced (see FIG. 1C). Then, a silicon oxide cap layer 13 is formed on the surface of the cured multi-layered stress film 10. As shown in FIG. 1C, since the above curing processes of the deposition and curing cycles usually result in shrinkage of the deposition and curing cycles, a seam 109 is created. The present invention is illustrated by referring to the four deposition and curing cycle processes. For achieving increased stress and reduced gap between adjacent devices, more than four deposition and curing cycle processes or at least one deposition and curing cycle process may be performed to produce the cured multi-layered stress film 10.

Figure 1D:
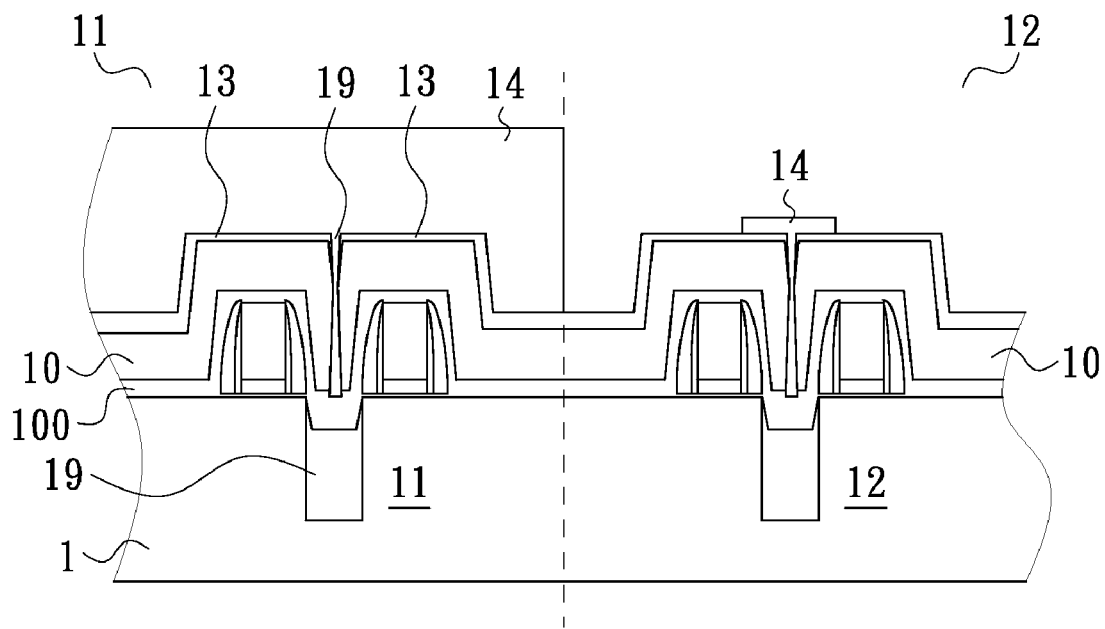
Figure 1E:
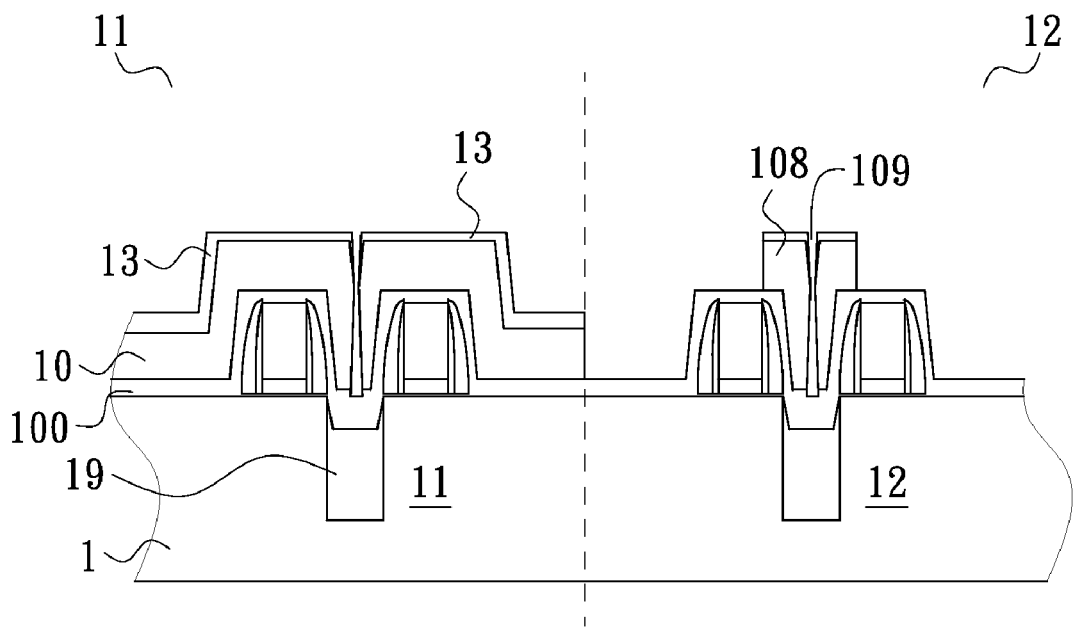

Then, a photoresist layer 14 is formed on the surface of the silicon oxide cap layer 13. Then, by a photolithography process, the photoresist layer 14 over the p-channel MOSFET 12 is removed but the photoresist layer 14 over the n-channel MOSFET 11 is retained. However, during the process of forming the photoresist layer 14, the photoresist material for forming the photoresist layer 14 may be filled into the seam 109. Generally, the photoresist material filled into the seam 109 is removed with difficulty and possibly overflowed. As shown in FIG. 1D, the overflowed photoresist material of the photoresist layer 14 over the p-channel MOSFET 12 fails to be completely removed.

Due to the overflowed photoresist material of the photoresist layer 14, in the subsequent process of removing the cured multi-layered stress film 10, the cured multi-layered stress film 10 fails to be completely removed. Consequently, a residual film structure 108 is formed over the p-channel MOSFET 12 (see FIG. 1E). The residual film structure 108 is detrimental to the subsequent formation of the compressive stress film over the p-channel MOSFET 12.

Figure 2A:
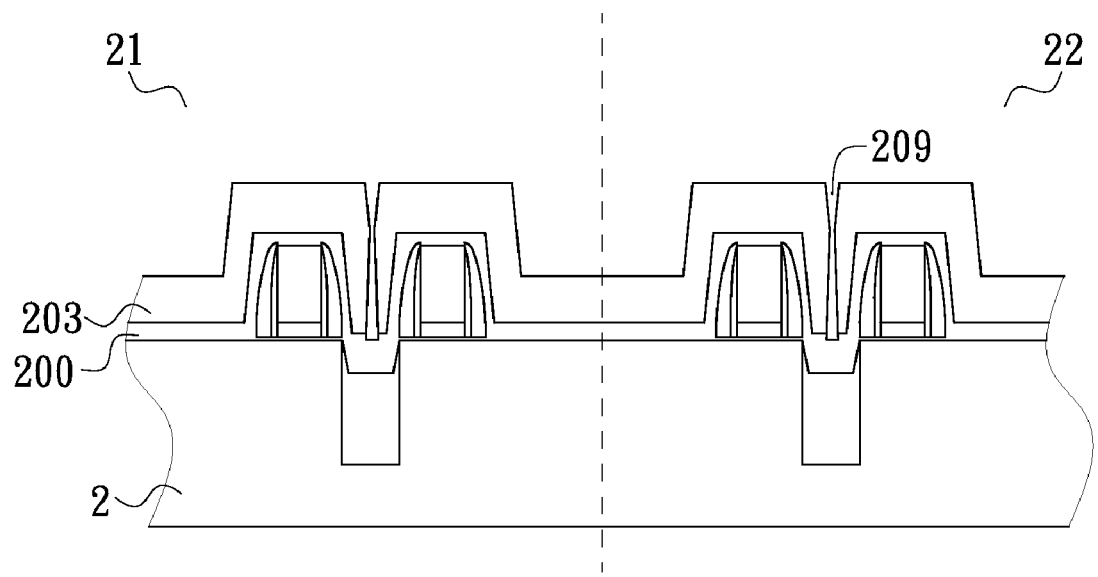
FIGS. 2A~2D are schematic cross-sectional views illustrating a partial process flow of a stress film forming method in the fabrication process of a CMOS device according to another embodiment of the present invention.
Figure 2B:
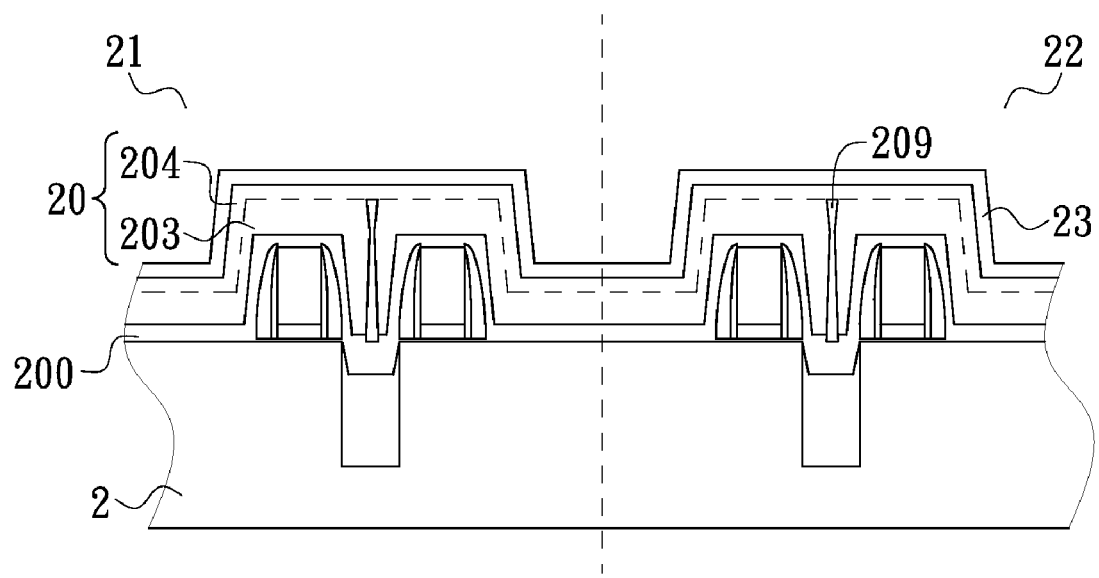

For solving the drawbacks of the four deposition and curing cycle processes, the present invention also provides another embodiment of the stress film forming method. In this embodiment, after the three deposition and curing cycle processes are completed, three cured stress films (e.g. tensile stress films) are stacked as a cured multi-layered stress film 203 (see FIG. 2A). Then, a fourth deposition process is performed to form a non-cured stress film 204 on the surface of the cured multi-layered stress film 203. Consequently, the cured multi-layered stress film 203 and the non-cured stress film 204 are collectively formed as a seamless tensile stress film 20. Then, as shown in FIG. 2B, a silicon oxide cap layer 23 is formed on the surface of the seamless tensile stress film 20. Since no additional curing process is done after the non-cured stress film 204 is formed on the surface of the cured multi-layered stress film 203, the non-cured stress film 204 is no longer shrunk. Consequently, the seam 209 is covered by the non-cured stress film 204 and no longer exposed outside. After the silicon oxide cap layer 23 is formed on the non-cured stress film 204, no seam is exposed. The present invention is illustrated by referring to the three deposition and curing cycle processes. For achieving increased stress and reduced gap between adjacent devices, more than three deposition and curing cycle processes or at least one deposition and curing cycle process may be performed together with a deposition only process.

Figure 2C:
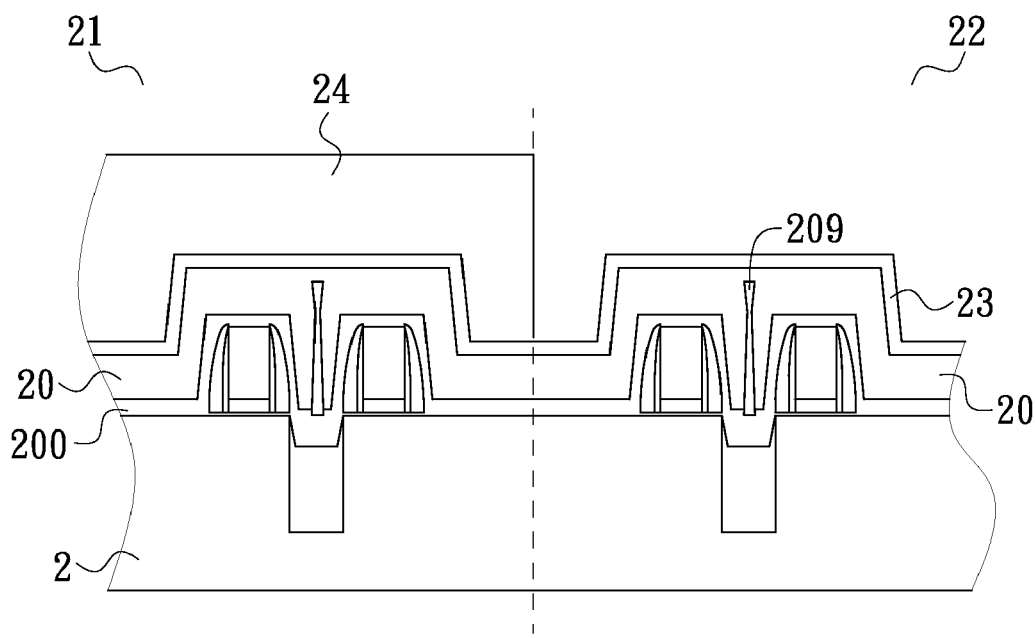

Then, as shown in FIG. 2C, a photoresist layer 24 is formed on the surface of the silicon oxide cap layer 23. Then, by a photolithography process, the photoresist layer 24 over the p-channel MOSFET 22 is removed but the photoresist layer 24 over the n-channel MOSFET 21 is retained. Since the photoresist material fails to be filled into the seam 209, the photoresist layer 24 over the p-channel MOSFET 22 can be completely removed.

Figure 2D:
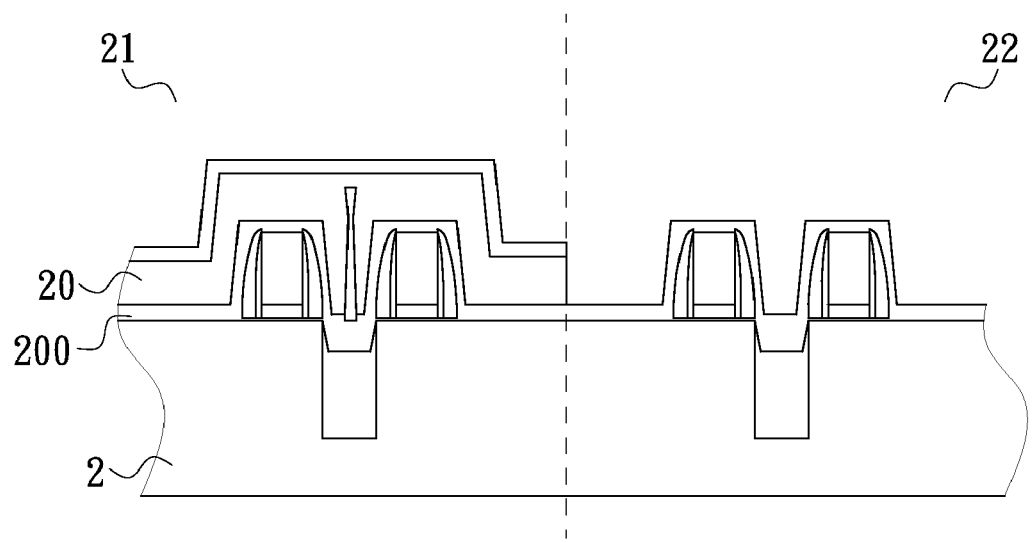

By using the photoresist layer 24 over the n-channel MOSFET 21 as an etch mask, an etching process is performed to remove the seamless tensile stress film 20 until an etch stop layer 200. The resulting structure is shown in FIG. 2D. Since no residual film structure is formed over the p-channel MOSFET 22, the seamless tensile stress film 20 can be completely removed. In such way, the subsequent formation of the compressive stress film (not shown) over the p-channel MOSFET 22 can be successfully made in order to apply a compressive stress to the p-channel MOSFET 22.

Figure 3:
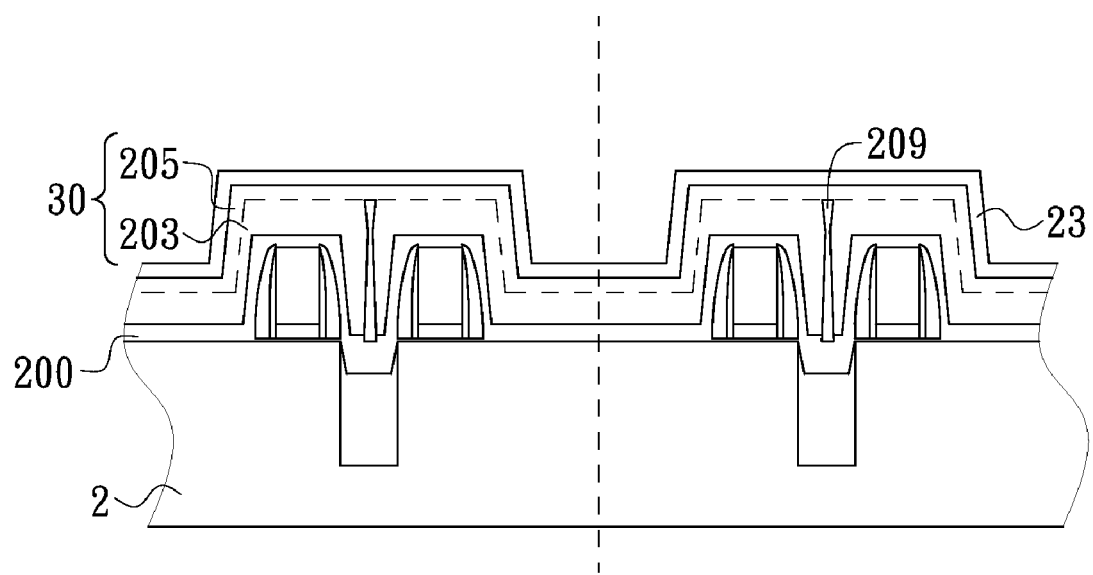
FIG. 3 is a schematic cross-sectional view illustrating a stress film structure formed by a stress film forming method in the fabrication process of a CMOS device according to a further embodiment of the present invention.

It is noted that numerous modifications and alterations of the connection member may be made while retaining the teachings of the invention. The present invention also provides a further embodiment of the stress film forming method. Firstly, similar to the procedures as described in FIGS. 2A and 2B, a non-cured stress film 204 is formed on the surface of the cured multi-layered stress film 203. Then, a semi-curing process is performed to convert the non-cured stress film 204 into a semi-cured stress film 205 (see FIG. 3). The operating time of the semi-curing process is shorter than the operating time of any curing process of the deposition-curing cycle processes, so that the shrinkage of the semi-cured stress film 205 is insufficient to create a seam. Under this circumstance, the cured multi-layered stress film 203 and the semi-cured stress film 205 are collectively formed as a seamless stress film 30.

In the above embodiments, the deposition processes of the deposition-curing cycle processes and the last deposition process are chemical vapor deposition process. Moreover, the curing processes of the deposition-curing cycle processes are UV curing processes.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stress film forming method for use in a fabrication process of a semiconductor device, the stress film forming method comprising steps of:
    providing a substrate, wherein a first-polarity-channel metal-oxide-semiconductor field-effect transistor (MOSFET) and a second-polarity-channel MOSFET are formed on the substrate;
    performing at least one deposition-curing cycle process to form a cured stress film over the first-polarity-channel MOSFET and the second-polarity-channel MOSFET; and
    performing an additional deposition process to form a non-cured stress film on the cured stress film, wherein the cured stress film and the non-cured stress film are collectively formed as a seamless stress film.

2. The stress film forming method according to claim 1, wherein the substrate is a silicon substrate, and the cured stress film and the non-cured stress film are made of silicon nitride, wherein the first-polarity-channel MOSFET is an n-channel metal-oxide-semiconductor field-effect transistor (NMOS), and the second-polarity-channel MOSFET is a p-channel metal-oxide-semiconductor field-effect transistor (PMOS).

3. The stress film forming method according to claim 1, wherein the deposition-curing processes are performed by steps of:
    performing a deposition process to form a stress film over the first-polarity-channel MOSFET and the second-polarity-channel MOSFET;
    performing a curing process to convert the stress film into a cured stress film; and
    repeating the cycle of the deposition process and the curing process for at least once.

4. The stress film forming method according to claim 1, wherein the deposition processes of the deposition-curing cycle processes and the additional deposition process are chemical vapor deposition process, and the curing processes of the deposition-curing cycle processes are UV curing processes.

5. The stress film forming method according to claim 1, wherein before the deposition-curing cycle processes, the stress film forming method further comprises a step of depositing an etch stop layer over the substrate, so that the cured stress film is formed on a surface of the etch stop layer.

6. The stress film forming method according to claim 1, further comprising a step of forming a silicon oxide cap layer on a surface of the seamless stress film.

7. A stress film forming method for use in a fabrication process of a semiconductor device, the stress film forming method comprising steps of:
    providing a substrate, wherein a first-polarity-channel metal-oxide-semiconductor field-effect transistor (MOSFET) and a second-polarity-channel MOSFET are formed on the substrate;
    performing at least one deposition-curing cycle processes to form a cured stress film over the first-polarity-channel MOSFET and the second-polarity-channel MOSFET;
    performing an additional deposition process to form a non-cured stress film on the cured stress film; and
    performing a semi-curing process to convert the non-cured stress film into a semi-cured stress film, wherein an operating time of the semi-curing process is shorter than an operating time of any curing process of the deposition-curing cycle processes, wherein the cured stress film and the semi-cured stress film are collectively formed as a seamless stress film.

8. The stress film forming method according to claim 7, wherein the substrate is a silicon substrate, and the cured stress film, the non-cured stress film and the semi-cured stress film are made of silicon nitride, wherein the first-polarity-channel MOSFET is an n-channel metal-oxide-semiconductor field-effect transistor (NMOS), and the second-polarity-channel MOSFET is a p-channel metal-oxide-semiconductor field-effect transistor (PMOS).

9. The stress film forming method according to claim 7, wherein the deposition-curing processes are performed by steps of:
    performing a deposition process to form a stress film over the first-polarity-channel MOSFET and the second-polarity-channel MOSFET;
    performing a curing process to convert the stress film into a cured stress film; and
    repeating the cycle of the deposition process and the curing process for at least once.

10. The stress film forming method according to claim 7, wherein the deposition processes of the deposition-curing cycle processes and the additional deposition process are chemical vapor deposition process, and the curing processes of the deposition-curing cycle processes are UV curing process.

11. The stress film forming method according to claim 7, wherein before the deposition-curing cycle processes, the stress film forming method further comprises a step of depositing an etch stop layer over the substrate, so that the cured stress film is formed on a surface of the etch stop layer.

12. The stress film forming method according to claim 7, further comprising a step of forming a silicon oxide cap layer on a surface of the seamless stress film.

13. A stress film structure formed over a first-polarity-channel metal-oxide-semiconductor field-effect transistor (MOSFET) and a second-polarity-channel MOSFET, which are formed on a substrate, wherein the stress film structure comprises:
    at least one cured stress film formed over the first-polarity-channel MOSFET; and
    a non-cured stress film formed on a surface of the cured stress film, wherein the cured stress film and the non-cured stress film are collectively formed as a seamless stress film.

14. The stress film structure according to claim 13, wherein the substrate is a silicon substrate, and the cured stress film and the non-cured stress film are made of silicon nitride, wherein the first-polarity-channel MOSFET is an n-channel metal-oxide-semiconductor field-effect transistor (NMOS), and the second-polarity-channel MOSFET is a p-channel metal-oxide-semiconductor field-effect transistor (PMOS).

15. The stress film structure according to claim 13, wherein the at least one cured stress film comprises a first cured stress film, a second cured stress film and a third cured stress film.

16. The stress film structure according to claim 13, wherein an etch stop layer is arranged between the cured stress film and the first-polarity-channel MOSFET and the second-polarity-channel MOSFET.

17. The stress film structure according to claim 13, further comprising a silicon oxide cap layer, which is formed on a surface of the seamless stress film.

18. A stress film structure formed over a first-polarity-channel metal-oxide-semiconductor field-effect transistor (MOSFET) and a second-polarity-channel MOSFET, which are formed on a substrate, wherein the stress film structure comprises:

at least one cured stress film formed over the first-polarity-channel MOSFET; and a semi-cured stress film formed on a surface of the cured stress film, wherein the cured multi-layered stress film and the semi-cured stress film are collectively formed as a seamless stress film.

19. The stress film structure according to claim 18, wherein the substrate is a silicon substrate, and the cured stress film and the semi-cured stress film are made of silicon nitride, wherein the first-polarity-channel MOSFET is an n-channel metal-oxide-semiconductor field-effect transistor (NMOS), and the second-polarity-channel MOSFET is a p-channel metal-oxide-semiconductor field-effect transistor (PMOS).

20. The stress film structure according to claim 18, wherein the at least one cured stress film comprises a first cured stress film, a second cured stress film and a third cured stress film.

* * * * *